(12) United States Patent
Yoshida et al.

(10) Patent No.: US 9,000,341 B2
(45) Date of Patent: Apr. 7, 2015

(54) METHOD FOR DETECTING LIGHT-EMITTING ELEMENTS HAVING UNIFORM LUMINOUS FLUX

(75) Inventors: Harunobu Yoshida, New Taipei (TW); Tz-Liang Chang, New Taipei (TW); Po-Hsiung Peng, New Taipei (TW)

(73) Assignee: Nisho Image Tech Inc., New Taipei (TW)

( * ) Notice: Subject to any disclaimer, the term of this patent is extended or adjusted under 35 U.S.C. 154(b) by 295 days.

(21) Appl. No.: 13/587,479

(22) Filed: Aug. 16, 2012

(65) Prior Publication Data

US 2013/0327920 A1 Dec. 12, 2013

(30) Foreign Application Priority Data

Jun. 8, 2012 (TW) .............................. 101120762 A

(51) Int. Cl.
*H04N 1/60* (2006.01)
*G03F 7/00* (2006.01)
*G03G 15/043* (2006.01)

(52) U.S. Cl.
CPC ................ *H04N 1/6033* (2013.01); *G03F 7/00* (2013.01); *G03G 15/043* (2013.01); *G03G 2215/0129* (2013.01)

(58) Field of Classification Search
USPC ..................... 250/208.1, 214.1, 206; 348/246
See application file for complete search history.

(56) References Cited

U.S. PATENT DOCUMENTS

| 2006/0193506 A1* | 8/2006 | Dorphan et al. ............... 382/145 |
| 2009/0021581 A1* | 1/2009 | Sun et al. ...................... 348/148 |
| 2011/0013053 A1* | 1/2011 | Chen et al. .................... 348/246 |

* cited by examiner

*Primary Examiner* — Francis M Legasse, Jr.

(57) ABSTRACT

A method for detecting light amount uniformity is applicable to a light-emitting device including a plurality of light-emitting elements. First, the light-emitting device is placed in a sensed region of a photo-sensing apparatus. Then, the following steps are executed N times: during the nth execution, turning on the (n+i×N)th light-emitting element, where i is 0 or a positive integer, n is less than or equal to N, and n and N are positive integers; detecting light emission of the light-emitting element with the photo-sensing apparatus to produce a scanned image; and finally, comparing whether the bright spots corresponding to the light-emitting elements in the scanned images produced through the N steps are consistent, and outputting an output signal indicating whether the light-emitting device is normal or abnormal.

8 Claims, 7 Drawing Sheets

METHOD FOR DETECTING LIGHT-EMITTING ELEMENTS HAVING UNIFORM LUMINOUS FLUX

CROSS-REFERENCES TO RELATED APPLICATIONS

This non-provisional application claims priority under 35 U.S.C. §119(a) on Patent Application No. 101120762 filed in Taiwan, R.O.C. on 2012 Jun. 8, the entire contents of which are hereby incorporated by reference.

BACKGROUND

1. Technical Field

The disclosure relates to a method for detecting a light amount, and more particularly to a method for detecting light amount uniformity of a light-emitting device.

2. Related Art

A photocopier, a printer, a fax machine, and a multifunction printer adopt electro-photography as the core technology for printing documents, that is, a photographic image is produced by changing an electrostatic charge distribution with light with a specific wavelength.

Please refer to FIG. 1, a schematic view of a color light-emitting diode (LED) printer 100 is shown. The LED printer 100 includes photoconductive drums (110K, 110M, 110C, and 110Y, generally referred to as 110), printing heads (120K, 120M, 120C, and 120Y, generally referred to as 120) and toner cartridges (130K, 130M, 130C, and 130Y, generally referred to as 130) that correspond to black, magenta, cyan and yellow, respectively. An even layer of charges is produced on the surface of the photoconductive drum 110 through a power distribution mechanism. Before printing, an exposure procedure is required in a scanning procedure, so that image pixels in the document to be printed are converted into bright and dark data of visible light. The printing head 120 has a plurality of LEDs. When the light emitted from the LEDs is projected on the photoconductive drum 110, original potential is maintained in unexposed areas, while potential of the charges in exposed areas varies due to the exposure. Due to the potential differences in the exposed areas, toner with a positive/negative charge provided in the toner cartridge 130 may be attracted, so as to achieve the printing objective.

FIG. 2 is a view illustrating a relationship between a printing concentration and exposure energy accepted by the photoconductive drum. As shown in FIG. 2, the printing concentration is positively correlated to the exposure energy of the photoconductive drum. When the exposure energy accepted by the photoconductive drum increases, the printing concentration also increases, thereby printing document content with different gray scales.

FIG. 3 is a schematic outside view of the printing head 120 of the LED printer 100. As shown in FIG. 3, the printing head 120 includes a plurality of light-emitting chips 122 arranged along an axis 140. Generally speaking, each light-emitting chip 122 includes thousands of linearly arranged LEDs. When the light-emitting chips 122 are arranged along the axis 140, the LEDs are also arranged along the axis 140, so as to achieve high DPI (Dots Per Inch) printing resolution. For example, to achieve a DPI resolution of 1200×2400, 1200 LEDs need to be arranged in every inch.

However, to achieve even concentration of the printed document, the light amount output by each LED in the printing head 120 must be controlled precisely, so as to avoid excessive exposure or inadequate exposure of exposed areas of the corresponding photoconductive drum 110. Since the light-emitting characteristics of the LEDs are different from each other, each light-emitting chip 122 must be tested and calibrated before being applied to the LED printer 100.

FIG. 4 is a schematic view illustrating detection of a light amount of the printing head 120. As shown in FIG. 4, the printing head 120 includes a light-emitting chip 122 having a plurality of LEDs 121, a drive circuit 123, a control unit 124 and a storage unit 125. The drive circuit 123 drives light output of the LEDs 121. The control unit 124 is coupled to the drive circuit 123, so as to control the light output (turn on or turn off), of the LEDs 121 and further control the light amount of output light 160. A photoelectric detector 150 moves along a direction and successively measures the light amounts output by the LEDs 121. The storage unit 125 stores parameters for adjusting the light amount output by each LED 121, so that the control unit 124 adaptively adjusts the light amount output by each LED 121.

However, each printing head 120 has a large number of LEDs 121, and each color LED printer 100 further includes four printing heads 120. If the numerous LEDs are measured one by one, a lot of time is spent and the production term of the product is delayed. Therefore, the approach to achieve efficient test and calibration is a subject to which the researchers in the art dedicate themselves.

SUMMARY

In view of the problems described previously, the disclosure provides a method for detecting light amount uniformity of a light-emitting device, so as to solve the problem in the prior art that it is difficult to efficiently detect the light output of the light-emitting device due to a large number of the light-emitting elements of the light-emitting device.

An embodiment of the disclosure provides a method for detecting light amount uniformity of a light-emitting device, where the light-emitting device includes a plurality of light-emitting elements arranged in series. The method for detecting light amount uniformity includes: placing the light-emitting device in a sensed region of a photo-sensing apparatus; executing a scanning procedure N times; comparing whether bright spots corresponding to the light-emitting elements in scanned images produced through the N times of scanning procedure are consistent, and outputting an output signal indicating that the light-emitting device is normal or abnormal.

The scanning procedure includes the following steps: during the nth execution, turning on the (n+i×N)th light-emitting element; and detecting light emission of the light-emitting element with the photo-sensing apparatus to produce the scanned image; where i is 0 or a positive integer, n is less than or equal to N, and n and N are positive integers.

Through the method for detecting light amount uniformity of the light-emitting device according to the disclosure, a light-emitting device having thousands of or more light-emitting elements can be detected by merely scanning for several times. Additionally, multiple light-emitting devices can be detected at one time. Therefore, the detection duration can be obviously shortened, and the light-emitting device can be efficiently detected.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
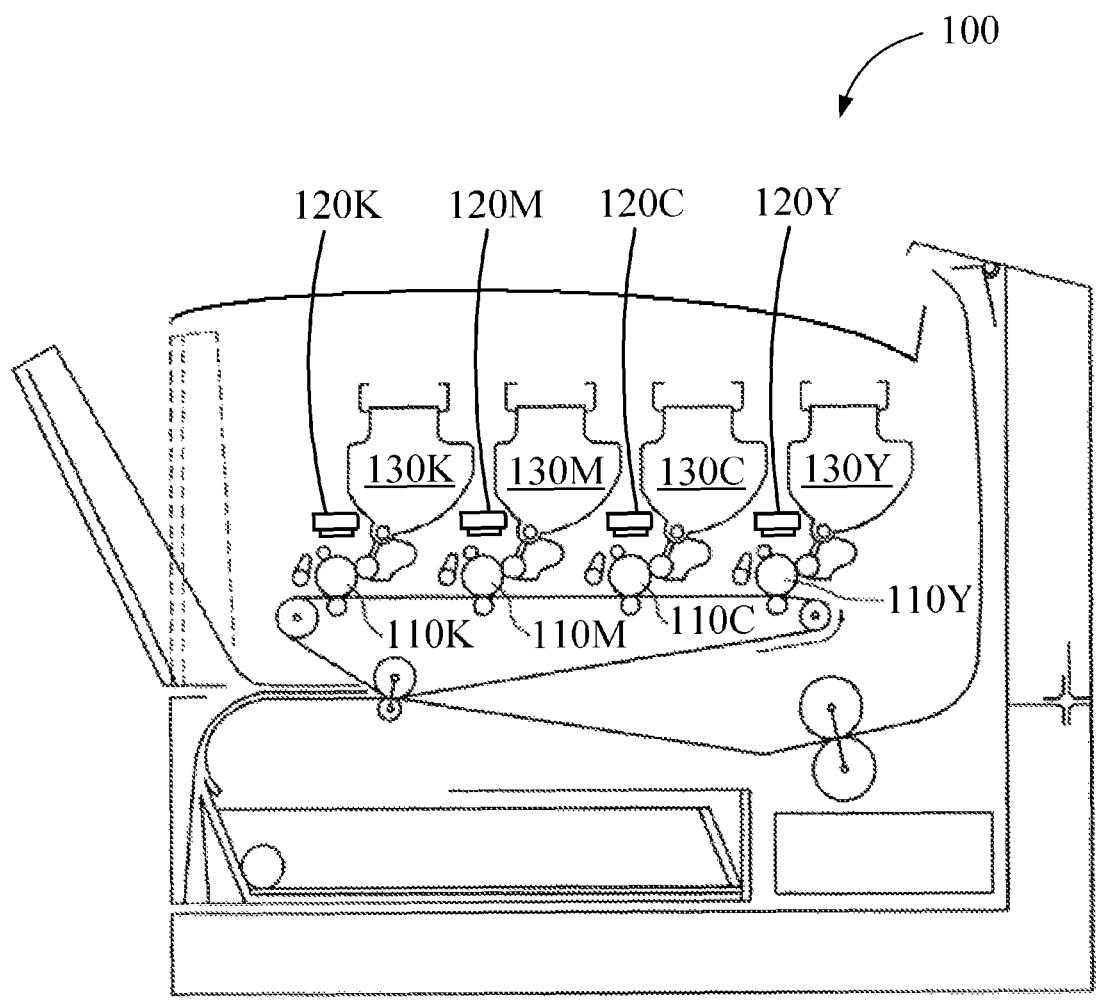
FIG. 1 is a schematic view of a color LED printer in the prior art.
Figure 2:
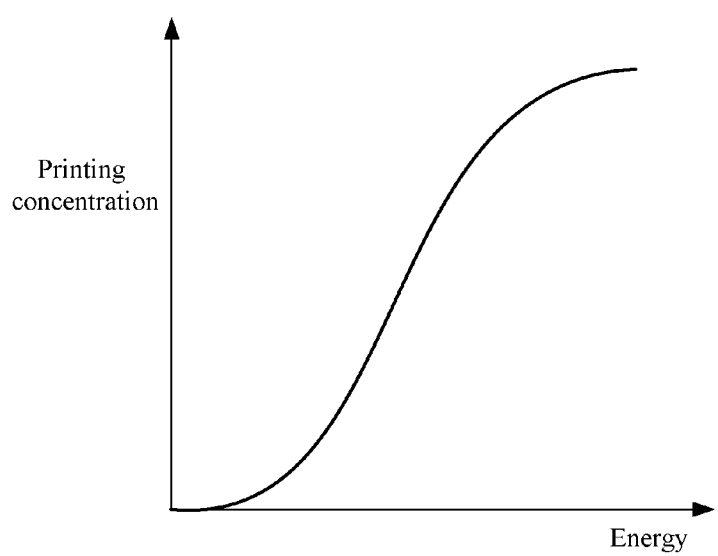
FIG. 2 is a view illustrating a relationship between an attracted toner concentration and exposure of a photoconductive drum in the prior art.
Figure 3:
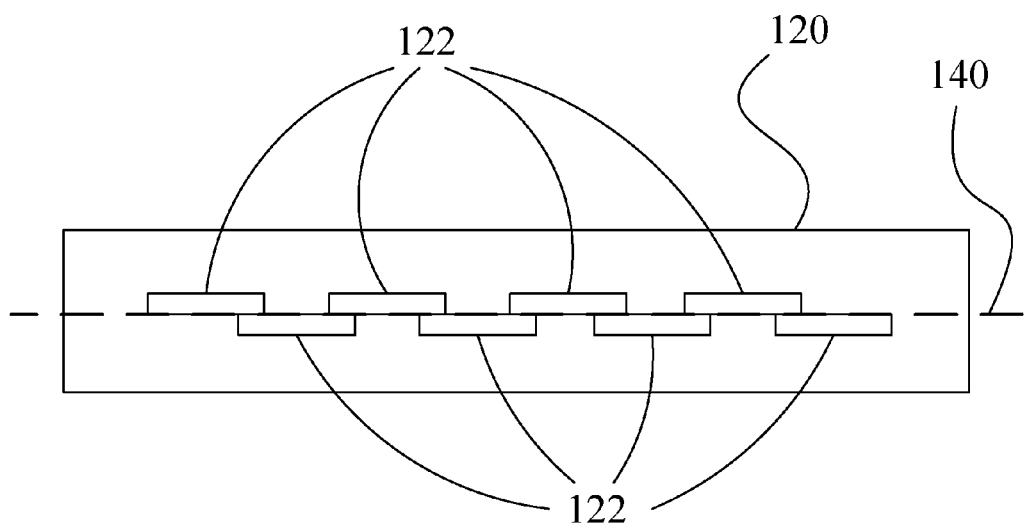
FIG. 3 is a schematic outside view of a printing head of the LED printer in the prior art.
Figure 4:
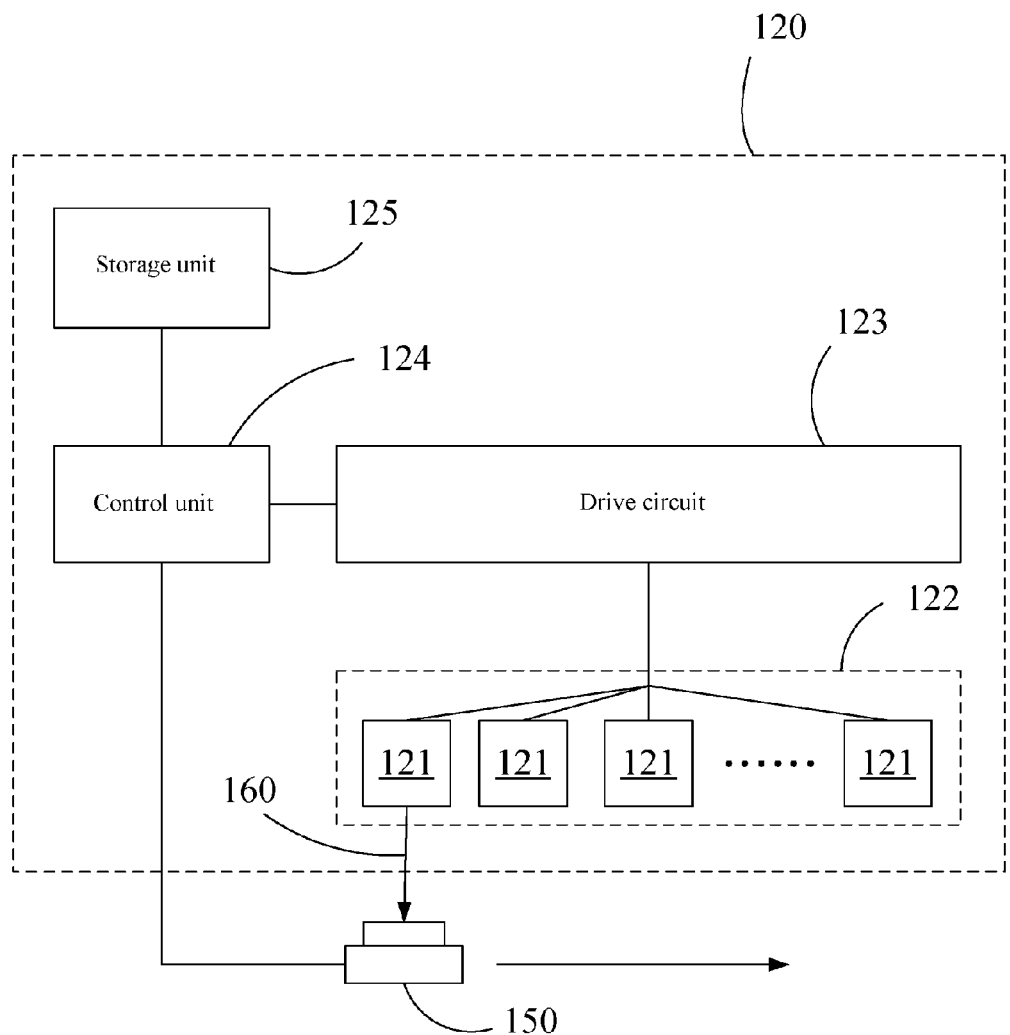
FIG. 4 is a schematic view illustrating detection of a light amount of the printing head in the prior art.
Figure 5:
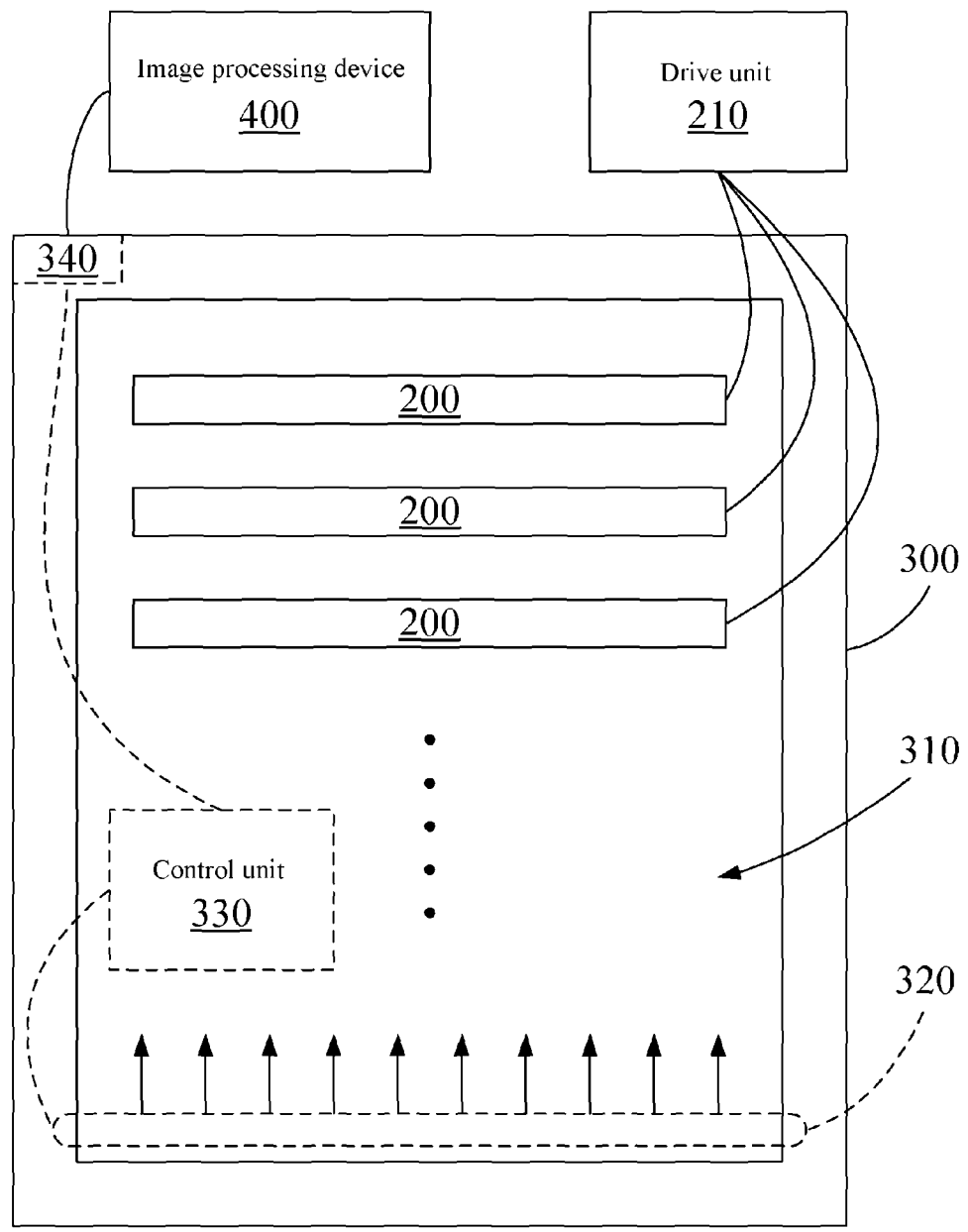
FIG. 5 is a schematic view illustrating detection of light amount uniformity of a light-emitting device according to an embodiment.

FIG. 5 is a schematic view illustrating detection of light amount uniformity of a light-emitting device 200 according to an embodiment.

As shown in FIG. 5, when the light amount uniformity is detected, the light-emitting device 200 is placed in a sensed region 310 of a photo-sensing apparatus 300. The light-emitting device 200, for example, the printing head 120 above, includes a plurality of light-emitting elements (not shown), arranged in series. The photo-sensing apparatus 300 is used to obtain an image in the sensed region 310, so that an image processing device 400 analyzes the obtained image and then judges whether the light amount output by the light-emitting device 200 is consistent.

In this embodiment, the light-emitting element may be a light output element such as an LED or a light-emitting thyristor. The light-emitting device 200 is a printing head in a printer, but the embodiment is not limited thereto, and the light-emitting device 200 may also be an exposure member applicable to an imaging device such as a fax machine or a photocopier.

As shown in FIG. 5, here the photo-sensing apparatus 300 is, for example, a scanner, but the embodiment is not limited thereto, and the photo-sensing apparatus 300 may also be a reading device capable of reading the image in the sensed region. The photo-sensing apparatus 300 includes a photo-reading element 320, a control unit 330 and a signal connection port 340. The control unit 330 is coupled to the photo-reading element 320 and the signal connection port 340. The image processing device 400 is coupled to the signal connection port 340 of the photo-sensing apparatus 300.

The control unit 330 is used to control the movement of the photo-reading element 320, receive an electric signal from the photo-reading element 320 after photoelectric conversion, and output an image signal to the image processing device 400 through the signal connection port 340.

Here, the image processing device 400 may be a device capable of processing an image such as a computer or a programmable logic circuit (Field Programmable Gate Array, FPGA).

As shown in FIG. 5, one or more light-emitting devices 200 may be placed in the sensed region 310, so as to detect, at the same time, whether the light amount output by the light-emitting device 200 is uniform. The number of the light-emitting devices 200 is determined according to the area of the sensed region 310 and the size of the light-emitting device 200. The drive unit 210 is coupled to the light-emitting device 200, so as to control the light emission, the output light intensity and the lighted duration of each light-emitting element in the light-emitting device 200.

Here, the drive unit 210 may be substantially implemented by a control chip and a surrounding circuit.

An operating principle of a method for detecting light amount uniformity of the light-emitting device 200 according to an embodiment is described in detail in the following.

Figure 6:
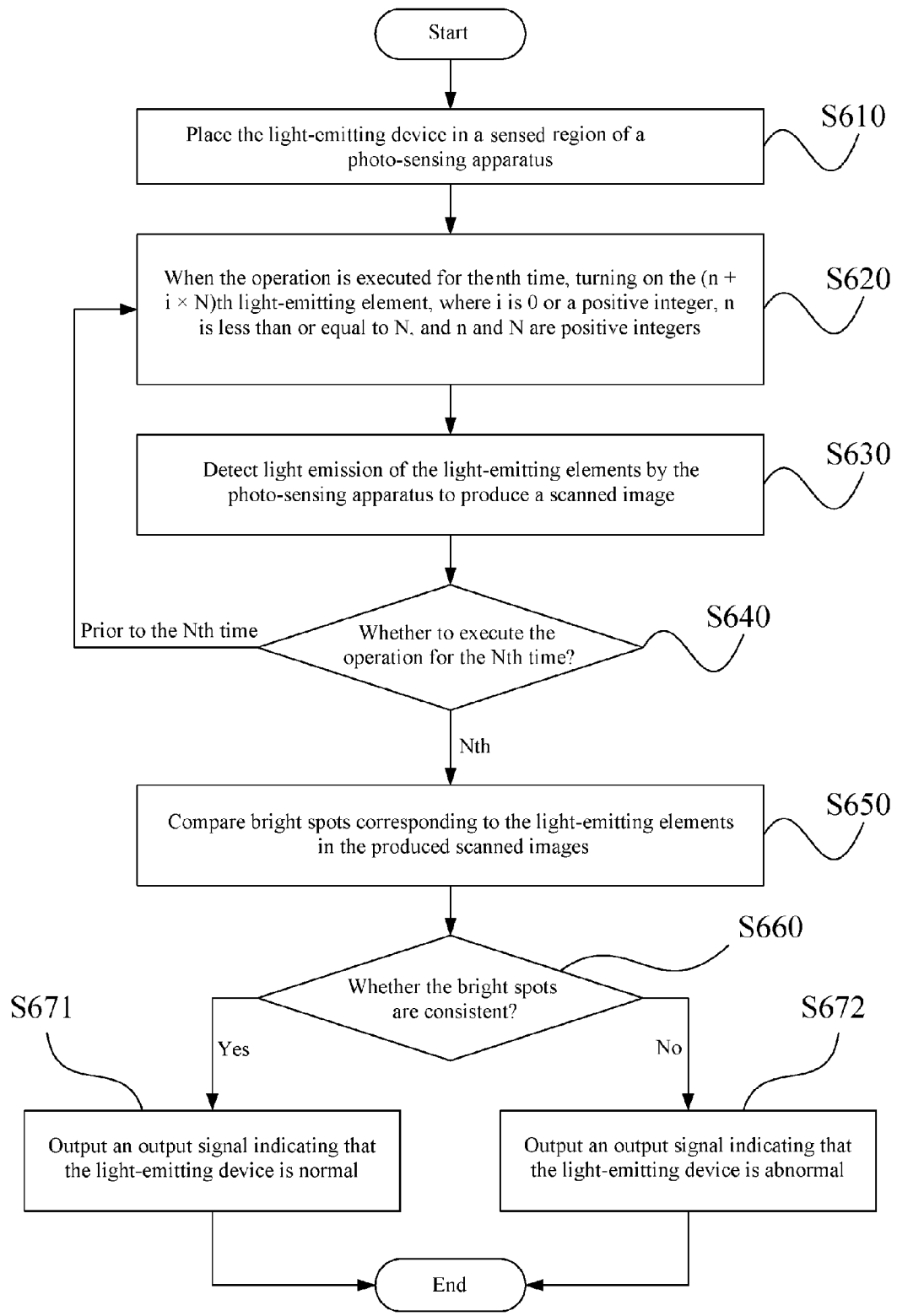
FIG. 6 is a flow chart illustrating detection of light amount uniformity of a light-emitting device according to an embodiment.

FIG. 6 is a flow chart illustrating detection of light amount uniformity of a light-emitting device 200 according to an embodiment.

Please refer to FIG. 5 and FIG. 6 in combination, in which after the photo-sensing apparatus 300 and the image processing device 400 are coupled and initialized, the light-emitting device 200 is placed in a sensed region 310 of the photo-sensing apparatus 300, and the adjacent light-emitting devices 200 are kept at a certain interval from each other, so as to prevent the emitted light from affecting each other (Step S610).

After Step S610, a scanning procedure is executed N times, and the scanning procedure includes Step S620 and Step S630. When the scanning procedure is performed for the nth time, the $(n+i \times N)$th light-emitting element is turned on (Step S620), where i is 0 or a positive integer, n and N are positive integers, and n is less than or equal to N (that is, 1 n N). Afterwards, the photo-sensing apparatus 300 detects light emission of each $(n+i \times N)$th light-emitting element to produce a scanned image (Step S630).

Figure 7A:
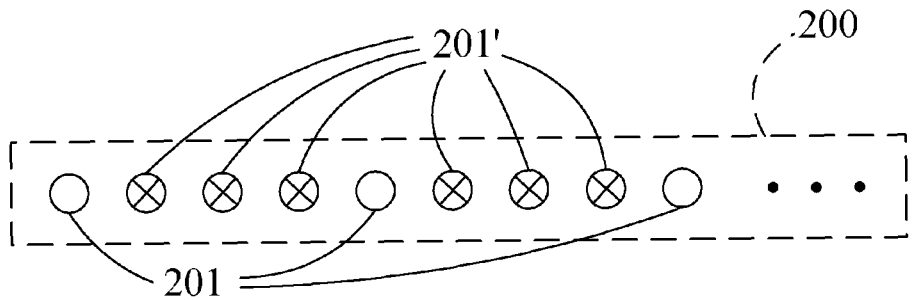
FIG. 7A is a schematic view illustrating first execution of a scanning procedure in an embodiment.
Figure 7B:
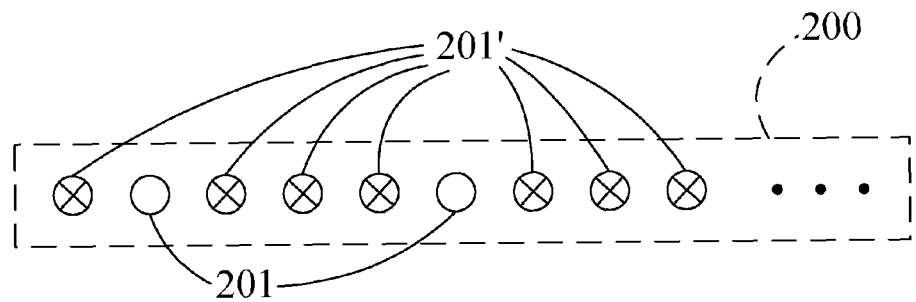
FIG. 7B is a schematic view illustrating second execution of the scanning procedure in an embodiment.
Figure 7C:
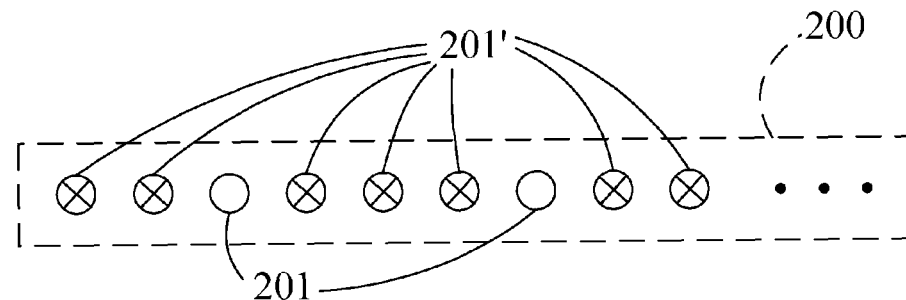
FIG. 7C is a schematic view illustrating third execution of the scanning procedure in an embodiment.
Figure 7D:
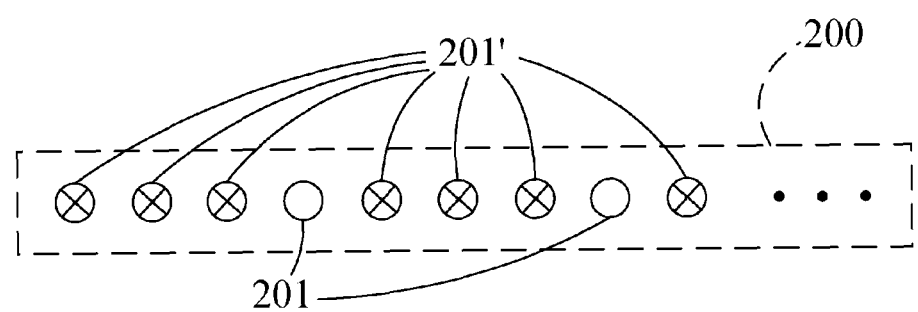
FIG. 7D is a schematic view illustrating fourth execution of the scanning procedure in an embodiment.

Please refer to FIG. 7A to FIG. 7B, in which an example in which the scanning procedure is executed, for example, four times (that is, N=4) for a light-emitting device 200 is taken for illustration. FIG. 7A is a schematic view illustrating first execution of the scanning procedure in an embodiment. FIG. 7B is a schematic view illustrating second execution of the scanning procedure in an embodiment. FIG. 7C is a schematic view illustrating third execution of the scanning procedure in an embodiment. FIG. 7D is a schematic view illustrating fourth execution of the scanning procedure in an embodiment.

As shown in FIG. 7A, during the first execution of the scanning procedure (that is, n=1), in Step S620, the first, the fifth, the ninth, . . . , light-emitting elements 201 are turned on, and other light-emitting elements 201' do not emit light. Then, in Step S630, image scanning is performed to obtain a first scanned image.

As shown in FIG. 7B, during the second execution of the scanning procedure (that is, n=2), the second, the sixth, the tenth, . . . , light-emitting elements 201 are turned on, and other light-emitting elements 201' do not emit light. Image scanning is performed to obtain a second scanned image.

As shown in FIG. 7C, during the third execution of the scanning procedure (that is, n=3), the third, the seventh, the eleventh, . . . , light-emitting elements 201 are turned on, and other light-emitting elements 201' do not emit light. Image scanning is performed to obtain a third scanned image.

As shown in FIG. 7D, during the fourth execution of the scanning procedure (that is, n=4), the fourth, the eighth, the twelfth, . . . , light-emitting elements 201 are turned on, and other light-emitting elements 201' do not emit light. Image scanning is performed to obtain a fourth scanned image. At this time, n=N, and the process turns to Step S650 (Step S640).

By executing the scanning procedure N times, light emitted from the adjacent light-emitting elements 201 is prevented from affecting each other, that is, it is avoided that the measured light amount includes the light emitted by the light-emitting element 201 to be measured and by the adjacent light-emitting element 201'.

Please refer to FIG. 5 and FIG. 6 again, in which in Step S650, bright spots corresponding to the light-emitting elements 201 in all the scanned images are compared. For example, in the embodiments shown in FIG. 7A to FIG. 7D, the bright spots corresponding to all light-emitting elements 201 in the light-emitting device 200 are obtained through the four times of scanning procedure, respectively, that is, the bright spots corresponding to all light-emitting elements 201 in the light-emitting device 200 are located in a scanned image, respectively. Therefore, when the bright spots are compared, the bright spots corresponding to a light-emitting device 200 in a single scanned image are compared, and further the bright spots corresponding to the light-emitting device 200 in all scanned images are also compared. Here, the size and gray-scale values of the bright spots can be compared.

In an embodiment, Step S650 further includes: combining the scanned images into an integral image, that is, the bright spots in the scanned images are combined and presented in the integral image, so that the bright spots corresponding to all light-emitting elements of a light-emitting device 200 can be compared in the integral image.

After the bright spots are compared, it is determined whether the bright spots are consistent (Step S660), if yes, an output signal indicating that the light-emitting device 200 is normal is output (Step S671); and otherwise, an output signal indicating that the light-emitting device 200 is abnormal is output (Step S672). Therefore, it can be known which light-emitting device 200 is normal or abnormal according to the output signal. For example, when it is detected that the bright spots of the first and the third light-emitting devices 200 are inconsistent, a signal including information indicating that the light-emitting devices 200 (the first and the third light-emitting devices 200) are abnormal is output.

Here, it may be compared whether the sizes and the gray-scale values of the bright spots all fall within an intended range. If the sizes or the gray-scale values of the bright spots all fall within the intended range, it indicates that the sizes or the gray-scale values of all bright spots corresponding to a light-emitting device 200 are consistent.

To sum up, according to the method for detecting light amount uniformity of a light-emitting device 200 of the disclosure, a light-emitting device 200 including thousands of or more light-emitting elements can be detected by merely several times of scanning. Additionally, multiple light-emitting devices 200 can be detected at one time. Therefore, it is not required to individually detect the light emission of each light-emitting element, which can shorten the detection duration and efficiently detect the light-emitting device 200.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for detecting light amount uniformity of a light-emitting device, wherein the light-emitting device comprises a plurality of light-emitting elements arranged in series and the method for detecting light amount uniformity comprises:
   placing the light-emitting device in a sensed region of a photo-sensing apparatus;
   sequentially executing a scanning procedure N times, wherein N is greater than 1 and less than a total number of light-emitting elements of the light-emitting device, and each nth scanning procedure comprises the following steps:
      turning on nth emitting element and every Nth light-emitting element after the nth light-emitting element, n is less than or equal to N, and n and N are positive integers;
      detecting light emission of the turned-on light-emitting elements by the photo-sensing apparatus to produce a scanned image; and
   comparing whether bright spots corresponding to the light-emitting elements in the scanned images produced through the N times of scanning procedure for are consistent, and outputting an output signal indicating that the light-emitting device is normal or abnormal.

2. The method for detecting light amount uniformity according to claim 1, wherein the comparing whether the bright spots corresponding to the light-emitting elements in the scanned images produced through the N times of scanning procedure are consistent is comparing the sizes of the bright spots.

3. The method for detecting light amount uniformity according to claim 1, wherein the comparing whether the bright spots corresponding to the light-emitting elements in the scanned images produced through the N times of scanning procedure are consistent is comparing the gray-scale values of the bright spots.

4. The method for detecting light amount uniformity according to claim 1, further comprising:
   combining the scanned images produced through the N times of scanning procedure into an integral image, comparing whether bright spots corresponding to the light-emitting elements in the integral image are consistent, and outputting the output signal.

5. The method for detecting light amount uniformity according to claim 4, wherein the comparing whether the bright spots corresponding to the light-emitting elements in the integral image are consistent is comparing the sizes of the bright spots.

6. The method for detecting light amount uniformity according to claim 4, wherein the comparing whether the bright spots corresponding to the light-emitting elements in the integral image are consistent is comparing the gray-scale values of the bright spots.

7. A method for detecting light amount uniformity of a light-emitting device, wherein the light-emitting device comprises a plurality of light-emitting elements arranged in series, the method for detecting light amount uniformity comprising:
   placing the plurality light-emitting device in a sensed region of a photo-sensing apparatus;
   dividing the plurality of light-emitting elements into a plural number of mutually exclusive subsets, wherein no two light-emitting elements are adjacent in a given subset;
   sequentially executing a scanning procedure for each subset, the scanning procedure for each subset comprising:
      turning on all of the light-emitting elements of the subset; and detecting light emission of the turned-on light-emitting elements by the photo-sensing apparatus to produce a scanned image for the subset;

determining whether bright spots corresponding to the light-emitting elements in the scanned images produced by the scanning procedure of each subset are consistent; and outputting an output signal indicating that the light-emitting device is normal or abnormal accordingly.

8. The method for detecting light amount uniformity according to claim 7, further comprising:

combining the scanned image for each subset into an integral image; and comparing whether bright spots corresponding to the light-emitting elements in the integral image are consistent.

* * * * *